United States Patent
Baeckler

(10) Patent No.: US 8,479,143 B1
(45) Date of Patent: Jul. 2, 2013

(54) SIGNATURE BASED DUPLICATE EXTRACTION

(75) Inventor: Gregg William Baeckler, San Jose, CA (US)

(73) Assignee: Altera Corporation, San Jose, CA (US)

( * ) Notice: Subject to any disclaimer, the term of this patent is extended or adjusted under 35 U.S.C. 154(b) by 125 days.

(21) Appl. No.: 12/720,529

(22) Filed: Mar. 9, 2010

(51) Int. Cl.
*G06F 17/50* (2006.01)
*G06F 11/22* (2006.01)
*G06F 9/455* (2006.01)

(52) U.S. Cl.
USPC .......... 716/135; 716/136; 716/104; 716/106; 716/107; 707/999.104; 707/999.107

(58) Field of Classification Search
None
See application file for complete search history.

(56) References Cited

U.S. PATENT DOCUMENTS

| | | | | |
|---|---|---|---|---|
| 4,882,690 | A * | 11/1989 | Shinsha et al. | 716/104 |
| 5,638,381 | A * | 6/1997 | Cho et al. | 714/732 |
| 5,875,112 | A * | 2/1999 | Lee | 716/107 |
| 6,519,609 | B1 * | 2/2003 | Touzet | 707/999.102 |
| 7,171,633 | B1 * | 1/2007 | Hwang et al. | 716/103 |
| 7,266,790 | B2 * | 9/2007 | Pandey et al. | 716/107 |

OTHER PUBLICATIONS

R-J Liao et al., A Signature-based Grid Index Design for RFID Main-Memory Databases, 2008 IEEE/IFIP International COnference on Embedded and Ubiquitous Computing, pp. 519-525, Mar. 2008.*
De Micheli, Giovanni, Synthesis and Optimization of Digital Circuits, Part III Logic Level Synthesis and Optimization 1994, pp. 267-548, McGraw-Hill.

\* cited by examiner

*Primary Examiner* — A. M. Thompson
(74) *Attorney, Agent, or Firm* — Mauriel Kapouytian & Treffert LLP; Thomas Treffert; Michael Mauriel

(57) ABSTRACT

Methods and apparatus are described for electronic design automation (EDA) that effects the identification, and possibly removal, of certain duplicate circuit components. A signature value representing a circuit component is used to help identify potential duplicates. A signature table stores information about one or more components that share a corresponding signature value. The table is populated during the course of processing the design for duplicate extraction. As each component in the design is encountered, a signature for the component is determined and used to access the signature table information. The current component is compared to any component found by using the signature table and a circuit design modification is indicated to consolidate the components if they are duplicative. The signature table is maintained to reflect the most recent component encountered for a given signature.

23 Claims, 6 Drawing Sheets

SIGNATURE BASED DUPLICATE EXTRACTION

BACKGROUND

Electronic Design Automation (EDA) applies computer technology to the problem of turning a user design for an electronic circuit into an implementation using integrated circuits (ICs). Without EDA the scale and complexity of modern integrated circuit devices would not be possible. A worthwhile endeavor of EDA processing is circuit optimization. One can consider, for example, the treatment of the subject in SYNTHESIS AND OPTIMIZATION OF DIGITAL CIRCUITS, by Giovanni De Micheli (McGraw-Hill, 1994), including *Part III, Logic Level Synthesis and Optimization*. One way to optimize a circuit is to eliminate circuit components that are needlessly redundant or duplicative.

SUMMARY

EDA methods and apparatus are disclosed for extracting or eliminating duplicate gates from a circuit design using gate signatures to locate potential duplicates. In one aspect, a signature table indexed by gate signature values, stores information about one or more gates that share a corresponding signature value. The table is populated during the course of processing the design for duplicate extraction. As each gate in the design is encountered a signature for the gate is determined and used to access the signature table information. The current gate is compared to any gate found by using the signature table and a circuit design modification is indicated to consolidate the gates if they are duplicative. The signature table is maintained to reflect the most recent gate encountered for a given signature.

In another aspect, computer readable media includes program code to effect EDA processing with signature based duplicate extraction.

In another aspect, an EDA computer system is provided that is operable to effect signature based duplicate extraction against a circuit design.

These and other aspects of the novel subject matter contained herein will become apparent by consideration of the material that follows.

DETAILED DESCRIPTION

Figure 1:
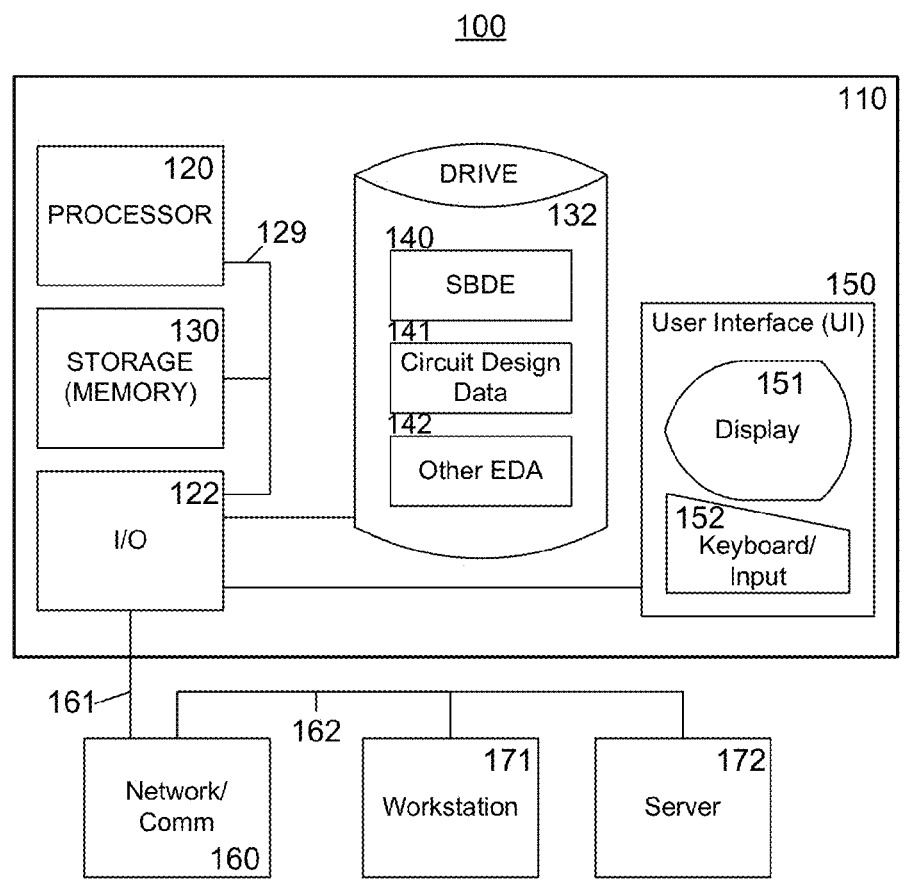
FIG. 1 is a block diagram of an example electronic design automation (EDA) computer and system in which inventive subject matter may be usefully employed.

FIG. 1 is a block diagram of an example electronic design automation (EDA) computer and system in which inventive subject matter may be usefully employed. EDA system 100 includes computer 110, network/communications facility 160, workstation 171, server 172, and interconnections therebetween. Computer 110 further includes a processor 120, memory 130, I/O circuitry 122, drive 132, user interface 150, and interconnections therebetween. Processor 120, memory 130, and I/O 122 are connected via bus 129. Drive 132 connects to I/O 122 and further includes signature based duplicate extraction (SBDE) 140, circuit design data 141, and other EDA 142 portions. User interface 150 connects to I/O 122 and further includes display 151 and user input 152.

Connection 161 connects between I/O circuitry 122 of computer 110 and network/communication facility 160. Facility 160 also connects to representative workstation computer 171 and representative server computer 172.

Processor 120 includes circuitry for executing program logic. Example embodiments include single and multiple core microprocessors, and programmable logic devices such as FPGA's. Data and program storage is provided by memory 130 and drive 132. Memory storage 130 in a microprocessor implementation of computer 110 represents high speed, volatile storage such as computer RAM. Disk storage 132 in computer 110 represents generally somewhat slower but persistent storage such as provided by, e.g., hard disk drives, flash drives, optical drives, solid-state drives, or the like, possibly including fixed or removable, electronic or non-electronic storage media.

User interface 150 is shown to include display 151 and user input 152. Display 151 is representative of the output side of user interface, i.e., displaying, presenting, reporting, or conveying information to a user in a user readable format. Displays of user interface 150 may include, for example, graphical display devices such as video monitors, electronic text display devices such as single or multiple line LCDs, printed output, and the like. Keyboard/input 152 is representative of the input side of user interface, i.e., receiving control and information signals that are controlled by or responsive to user activity or action. Input devices of user interface 150 may include, for example, keyboards, touch screens, pointing devices such as mice and pen tablets, and the like.

SBDE 140 depicted in persistent storage 132 represents program code and related processing data for performing signature based duplicate extraction as described herein. SBDE 140 may be represented in storage in any number of ways. For example, SBDE 140 may include multiple modules, files, subfiles, file portions, and/or directories. SBDE 140 may, for example, be independently identifiable, in whole or in part, within a file system used to organize drive 132, or may be integrated with other stored program and data content from a file system perspective. For example, SBDE 140 may or may not be distinguishable from a file system perspective from other EDA 142, in whole or in part. Other EDA 142 represents stored program code and related processing data related to electronic design automation functions including, for example, integrated user presentation, circuit definition tools, VHDL code editors, design compiler components (including, e.g., synthesis, place and route, etc.), simulators, debug tools, and the like. One of skill understands without further explanation the close relationship between memory 130 and drive 132 in performing a storage function for programs and data; and the copying, relocation, movement, or migration readily supported, if not expected, between the two (and among any additional storage devices).

Circuit design data 141 represents stored data that represents the design for an electronic circuit. Circuit design data 141 may include various information about the components in a circuit and their interconnections. Such data may be conveniently represented in a netlist format. Multiple such representations for a particular circuit design may exist in storage and may change over time, particularly as the consequence of EDA program execution (for example, SBDE 140 and other EDA 142). Circuit design data 141 may include additional information, for example, information regarding the circuit design on the whole such as an identification of a device or technology in which the circuit design is to be implemented.

Computer 110 may be a general purpose computer with appropriate software to effect EDA processing, or may be a special-purpose computer dedicated to EDA functions.

One of skill in the art appreciates that computer system 100 is only illustrative of the many computers and configurations possible for implementing novel subject matter disclosed herein. For example, while computer 110 of system 100 readily lends itself to performing EDA processing on a standalone basis, the persistent storage function represented by drive 132 and the program execution function represented, at least in part, by processor 120, may be variously distributed among multiple computers including, for example, computer 110, workstation 171, and server 172. Similarly, the user interface devices represented by 150 could be substituted for by similar devices of workstation computer 171, i.e., computer 110 could support a remote user interface, for example. And again, computers 110, 171, and 172 could be implemented using virtual machines, and all three virtual machines could be implemented using a single computer hardware platform configured very much as illustrated for computer 110. Accordingly network/communication facility 160 could be a local soft or memory/storage-based communication facility (such as an interprocess communication, or IPC, facility), and does not necessarily include a remote communication link or network, or the like. These and other departures and variations are possible from the computer system 100 depicted in FIG. 1, which is only illustrative.

Figure 2:
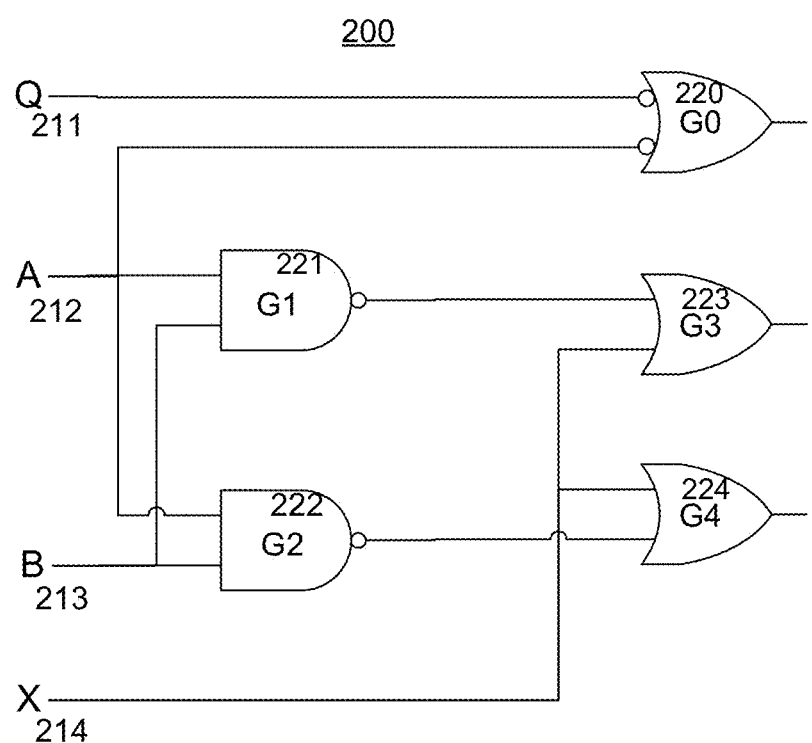
FIG. 2 depicts a circuit design portion.

FIG. 2 depicts a circuit design portion. FIG. 2 is a useful aid to illustrate the usefulness and operation of subject matter disclosed elsewhere herein. Circuit design portion 200 includes five gates 220-224 identified as G0 through G4, respectively. Circuit design portion 200 also includes input signals 211-214 (identified as Q, A, B, and X, respectively). Each of gates G0 through G4 are simple logic gate. Gates G1 and G2 are 2-input NAND gates, gates G3 and G4 are 2-input OR gates, and gate G0 is a 2-input OR gate with inverting inputs. Circuit portion 200 will be understood to represent only a tiny fraction of the amount of circuitry included in a modern IC design. Circuit portion 200 will also be understood to represent a user circuit design as it might appear at any of a number of processing stages during its development life-cycle as it moves from user specification (entry into the computer system) to the one or more computer files associated with a specific hardware implementation (e.g., geometry files for mask generation, configuration data files for a programmable logic device, etc.).

While only simple logic gates are shown in circuit portion 200 for simplicity and clarity, the gates of a circuit design to which disclosed methods and apparatus may apply are not so restricted. A circuit design may well include much more complex gate entities. For example, a multiplier or adder may appear as a gate in a circuit design, representing an increment in complexity greater than that of a simple logic gate, and so on. Further, while FIG. 2 is a graphical representation of a circuit design portion, more importantly such a circuit design portion may also have a corresponding computer representation. Logical netlists and the lower-level logical and/or physical data structures used in their implementation are one well known way in the at to represent a circuit design within an EDA computer system. Generally, then, as discussed herein, a circuit design is a computer-based representation of a circuit design, and a gate is a component part of that representation.

Turning to the details of circuit portion 200 we see opportunity for circuit optimization through the elimination of duplicate gates. Close study of circuit portion 200 reveals that gate G1 221 and gate G2 222 each performs an identical logic function (NAND) on an identical set of inputs (signals A 212 and B 213), and so duplicate one another. Gate G1, however, has its output directed to gate G3, while gate G2 has its output directed to gate G4. By connecting the output of either G1 or G2 to the downstream input(s) being supplied by the other, one of the duplicate gates can be eliminated from the circuit design. For example, if the input of G3 connected to the output of G1 is instead connected to the output of G2, then gate G1 can be removed from the circuit design. Alternatively, if the input of G4 connected to the output of G2 is instead connected to the output of G1, then gate G2 can be removed from the circuit design with no functional difference. Checks can be made, of course, as part of this process before such an extraction of the duplicate gate. For example, extraction of a duplicate gate from a circuit may be suppressed where the equivalent gate is already at maximum fanout capacity and cannot be used to drive additional gate inputs for electrical or timing reasons. Other such checks and responses are readily possible.

It is further noted that when looking for an identical set of inputs as between two gates, input function and equivalence may be considered over and above logical designation or physical location. For example, the inputs shown for gate G1 are equivalent (interchangeable). Whether the A signal source is connected to the upper input and the B signal source is connected to the lower input (as appearing in FIG. 2), or vice versa, the circuit produces the same result. Accordingly, when looking for a corresponding input signal source on G2 for the upper input of G1, the analysis may consider whether either the upper or lower input of G2 shares the same input signal source, not just the upper input of G2 which corresponds by strict logical or physical designation. Not all inputs on a gate, of course, may have equivalence such as described here. For example, a SELECT input signal on a mux gate would likely not be considered equivalent or interchangeable with a DATA input signal.

Circuit portion 200 further illustrates how the process of duplicate extraction may uncover additional obvious duplicates. With the circuit design as depicted in FIG. 2, gates G3 and G4 are not immediate duplicates. While gates G3 and G4 perform the identical logic function (OR) and each has a first input attached to signal X, their second inputs are attached to different signal sources, i.e., gate G3 receives an input from the output of gate G1, while gate G4 receives an input from the output of gate G2. Once circuit portion 200 is modified to eliminate the duplication of gates G1 and G2, however, gates G3 and G4 will be readily identifiable as duplicates and candidates for consolidation.

Lastly, circuit portion 200 illustrates another possible aspect for the determination of duplicate gates. Earlier, it was easy to identify Gates G1 and G2 as having identical function as each is clearly depicted with the symbology of a standard NAND gate. It is less obvious that gate G0 is equivalent to gate on a function-wise basis, yet such DeMorgan equivalents are well known in the art. Accordingly, logical gate behavior, over and above strict gate type, may be useful in identifying duplicate gates in a circuit design. (Note that differing input signal sources preclude gate G0 as a duplicate of either for the circuit shown in FIG. 2.)

Generally, a gate can be considered a duplicate if it implements the same logical result as a comparand gate and if its input signal sources are identical or equivalent. Embodiments may vary in determining the equivalence of input signal sources and a single embodiment may employ a variety of criteria. For example, a signal having the value (A xor A xor B) may be considered equivalent to a signal having the value (Z xor Z xor B), both reducible to the value B. As another example, a generous equivalence rule could be applied for "don't care" signals in a netlist. One of skill in the art appreciates the range of freedom and variety in the depth, sophistication, and complexity of processing possible to identify duplicate gates.

Figure 3:
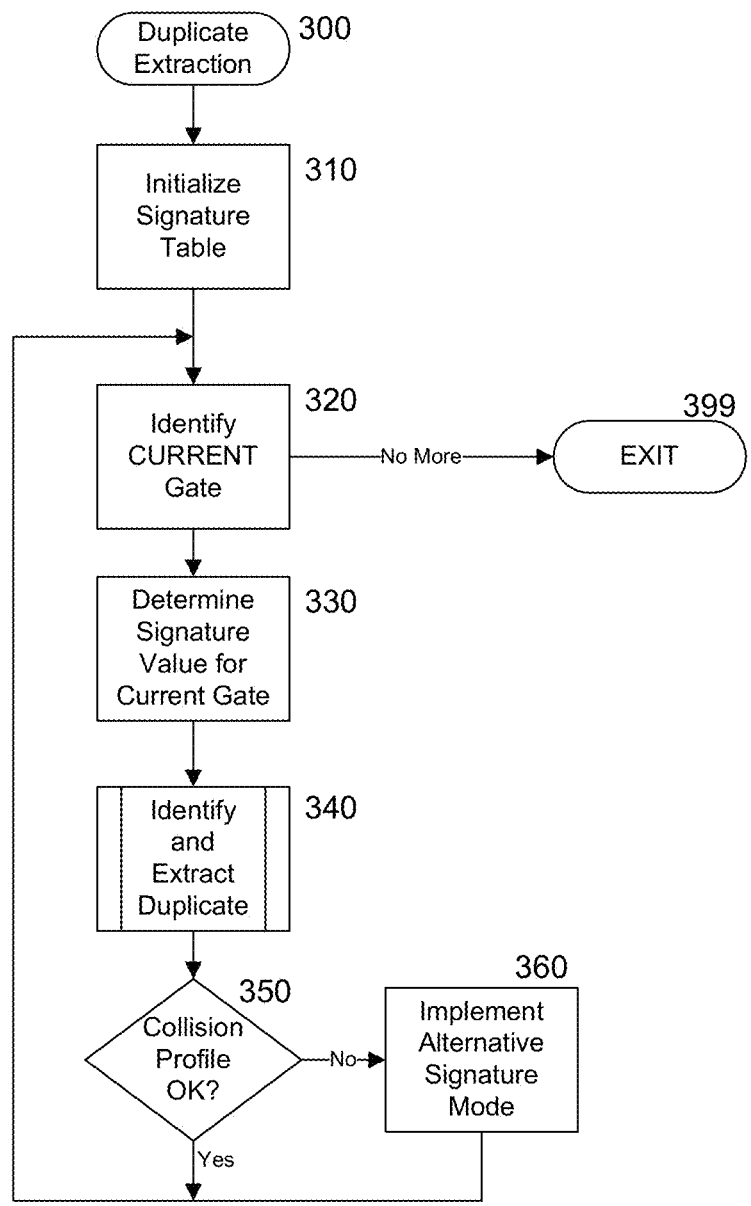
FIG. 3 is a flowchart for a duplicate extraction and processing run.

FIG. 3 is a flowchart for a duplicate extraction and processing run. The process for duplicate gate extraction is entered at block 300. In the embodiment depicted and described in relation to FIG. 3, the signature table is initialized at block 310 by setting all entries in the signature table to zero. In this embodiment, a zero value serves as an indicator that the signature table entry is empty or invalid. In other embodiments, other values, mask bits, tags, or other indicators could be used to indicate empty or invalid entries.

With initialization complete, the main loop for duplicate extraction begins at block 320. At block 320, a gate in the circuit design is selected as the current gate for consideration. Gate selection can simply involve taking progressive nodes as they appear in a flattened netlist. In such a case, the flattened netlist may be pre-ordered according to appearance in design source files. Other schemes for gate selection with varying degrees of elaboration for navigating netlist nodes, or other representative construct, could also be used. A netlist representation could also be used that is pre-ordered according to circuit topology such as from outputs to inputs, or inputs to outputs. Once the current gate is identified, its signature value is determined at block 330. The signature is then used at block 340 to determine whether the current gate is duplicative of one (or possibly, several) most recently encountered gate(s) having the same signature. (Encountered gates are those gates of the netlist that were each previously identified as the current gate.) If duplication is found, a redundant gate is extracted from the circuit design. The process of identifying and extracting a case of duplicate gates is discussed more fully in relation to FIG. 4.

One of skill in the an appreciates that implementation details for processing activities discussed herein can vary widely. For example, a selection or identification activity may entail one or more discrete data processing operations such as selecting, designating, marking, indicating, tagging, referencing, locating, pointing, etc., and may be conducted directly or indirectly on a data representation or a copy. As another example, association of data processing objects such as datums, scalars, structs, records, fields, segments, files, composites, etc., may entail one or more discrete data processing operations such as pointing, referencing, moving, copying, etc., directly or indirectly. Illustrated embodiments and their discussion are presented to help develop an understanding of novel subject matter and not to limit or restrict the freedom that one of skill may use to embody that subject matter.

At 350, a check is included in this embodiment to assess whether a profile of signature collisions experienced over many gates is acceptable. Such a check allows for dynamic adaptation of the duplicate extraction process to attempt to minimize overall resource consumption. This can be worthwhile because duplicate extraction may be performed many times in the compilation of a user circuit design and, even when highly optimized, is resource intensive. Using a small signature, for example, can significantly reduce for the overall size of the signature table and improve the cache residency of signature table entries, however, a small signature size may result in a large number of collisions where substantially different gates share the same signature value. Frequent collisions can result in a substantial increase demand on processing power while at the same time reducing the effectiveness of the duplicate extraction process. In one embodiment, collision frequency is considered acceptable if false positives (i.e., identical signatures for nonduplicate gates) remain below about 10%. If the collision profile is determined to be unacceptable then a dynamic adjustment of the signature mode is made at block 360. In one embodiment the signature mode is changed by changing the size of the signature, for example, moving from an 8-bit signature to a 16-bit or 32-bit signature. Such a change in the size may be accompanied by a change in storage representation for the signature table, for example, moving from a straightforward memory array to a linked data structure suited to sparser data distribution.

Figure 4:
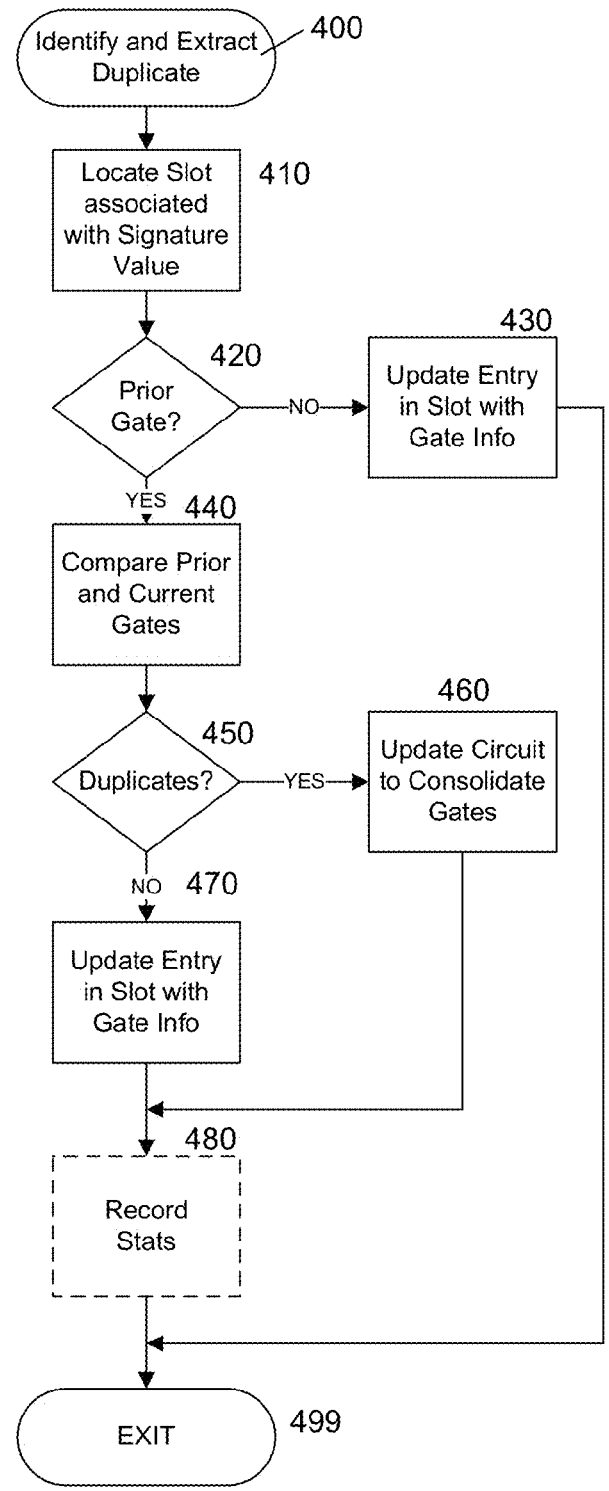
FIG. 4 is a flowchart for identifying and extracting duplicate gates from a circuit design.

FIG. 4 is a flowchart for identifying and extracting duplicate gates from a circuit design. The process depicted in FIG. 4 is one possible embodiment for the processing of block 340 of FIG. 3. The FIG. 4 process for identifying and extracting duplicate gates is entered at block 400 with a current gate identified and its signature value already determined. At block 410 a slot in a signature table is located that is associated with the signature value of the current gate. In one embodiment the signature value is itself an index value into a signature table with fixed length slots and occupying a single extent within a memory address space. This permits the signature value to be used to directly calculate the location in memory of the corresponding signature table slot.

Figures 5, 6:
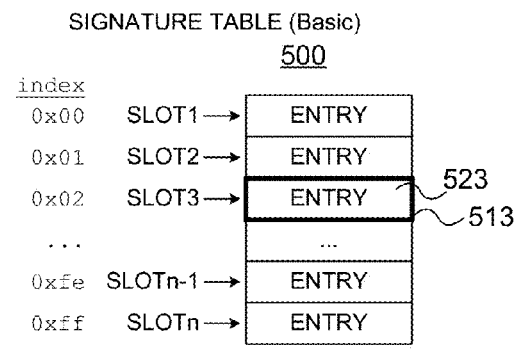
FIGS. 5 and 6 depict example signature tables.

FIGS. 5 and 6 depict example signature tables. FIG. 5 illustrates a first example embodiment of a signature table. In signature table 500, slots are located consecutively in memory. Each slot corresponds to one possible signature value. Each slot of table 500 contains a single signature table entry. For example, SLOT3 513 of signature table 500 contains signature table entry 523, and may be coextensive with it. Notably, entries in the signature table do not contain signature values but rather contain information that associates the slot with a particular gate instance in the circuit design being processed. Entries are sized accordingly. In one embodiment, each entry in the signature table is 32 bits wide and holds a pointer value to the location of gate data in storage holding the circuit design. In one embodiment, the signature values are eight bits wide resulting in signature table index values ranging from 0x00 through 0xff (0-255 decimal) as indicated at the side of signature table 500 in FIG. 5. In such an embodiment, SLOTn is SLOT255, and SLOTn–1 is SLOT254. Where each entry is 32 bits wide and each slot is coextensive with its single entry, the signature value for a gate can quickly be shifted to determine the offset of the corresponding slot from the beginning of the signature table.

FIG. 6 illustrates a second example embodiment of the signature table. Signature table 600 builds on the basic signature table of FIG. 5 by adding depth to the table, i.e., by supporting multiple entries within each slot. Signature table 600 of FIG. 6 shows, for example, slot 613 having ENTRY1 631, ENTRY2 632, ENTRYn 639, and any intervening entries. In one embodiment, the slots of table 600 are identical in size supporting a fixed number of entries each having a fixed length. Again, consecutive entries within a slot occupy consecutive memory locations, and consecutive slots follow one another in memory. Such a fixed length structure simplifies and speeds locating the relevant signature table entries. As with signature table 500 of FIG. 5, the entries of signature table 600 of FIG. 6 contain information that associates the slot with a particular gate instance in the circuit design being processed. As will become apparent, each gate instance in the circuit design associated by information in an entry within a signature table slot, has the signature value corresponding to that slot.

Returning to FIG. 4, once the slot corresponding to the current gates signature value is located at block 410, a check is made at 420 to determine whether a prior gate (i.e., a gate that was earlier the current gate in the duplicate extraction process) is recorded in an entry of the located slot. If not, the slot entry is updated to reflect the current gate's association with the slot. In one embodiment, this is accomplished by recording in the signature table entry a pointer value to the gate instance in the circuit design. Because an association with a prior gate having the same signature was not found the process of FIG. 4 can be exited at 499.

In the case where processing at 420 determined a prior gate to be recorded in an entry of the located slot, processing proceeds to block 440 where the current gate is compared to the recorded prior gate to detect duplication. Duplication can be determined by analyzing the identity or equivalence of gate type and input signal sources as discussed earlier in relation to FIG. 2. Gate behavior is another factor that may be included in the determination as discussed earlier in relation to the DeMorgan equivalent of FIG. 2. Other factors may also be included in the determination such as electrical or timing properties, for example. The comparison at block 440 of FIG. 4 results in a determination of whether the current gate duplicates a prior gate at block 450. If not, the slot entry is updated to reflect the current gate's association with the slot. Again, in one embodiment this is accomplished by recording in the signature table entry a pointer value to the gate instance in the circuit design. A signature table slot in this fashion reflects the most recently encountered gate instance having the corresponding signature value. While recording only the most recently encountered same-signatured gates (and so comparing only the most recent encounters) may result in some missed duplicates, processing is very efficient. Moreover, and as a practical matter, duplicates are most often found near one another in a circuit representation like a netlist, reducing the likelihood that true duplicates are missed. Of course, it is possible within an embodiment to adjust the discretionary ordering of circuit design (e.g., netlist) gates to increase the likelihood of duplicate nearness, for example, by pre-sorting.

If instead at block 450 it is determined that the current gate and a prior gate are duplicates, then the circuit design is updated at 460 to consolidate the gates. The gates may be merged by moving connections at the output(s) of one gate to the corresponding output(s) of the other, and then removing the gate and its input connections from the circuit design. Either of the gate instances may be merged into the other, and the selection of a merged gate may be based on any number of factors including, for example, the total number of connections made to each instance. The surviving gate is appropriately reflected in the active signature table slot after consolidation.

At block 480, information may be recorded about the results of the duplicate identification and extraction process for the current gate. For example, it may be desirable to record the fact that signature collision occurred for non-duplicate gates and, possibly, to record the degree of deviation of that collision (for example, where signature collision occurred for significantly different gate types). Such collected information may then be used to dynamically adapt the immediate or subsequent duplicate extraction processing, or may be reported out for use in assessing the effectiveness of a particular duplicate extraction embodiment. Thereafter, duplicate identification and extraction processing completes for the current gate at 499.

Figure 7:
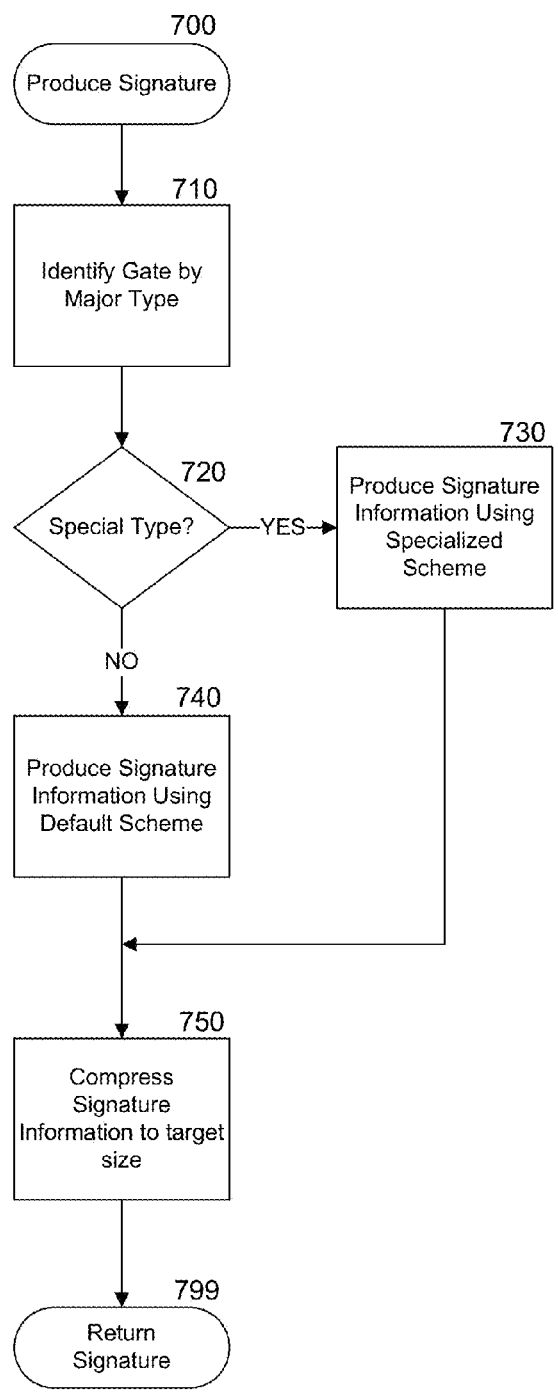
FIG. 7 is a flow chart for a process of producing a signature value.

FIG. 7 is a flow chart for a process of producing a signature value. A process after the fashion of that depicted in FIG. 7 may be used to implement the processing of block 330 of FIG. 3. The signature-producing process of FIG. 7 is entered at block 700. At block 710, the type of the current gate is identified. In one embodiment, the type of a gate is a major type (i.e., a type having some level of generality so as to possibly classify one or more specific types) and is directly available from the gate instance information stored in the circuit design. Examples of major gate types in one embodiment for purposes of illustration include AND, OR, NAND, NOR, XOR, Lookup Table (LUT), and D Flip-Flop (DFF) gate types. Each of these major gate types may classify a number of more specific gate types. For example, the AND major gate type may be used to identify 2-input, 3-input, 4-input, and so on, type AND gates. For another example, the LUT major gate type may similarly be used to identify a number of specific LUT types, having, for example, 16-, 32-, or 64-bit table sizes and four, five, or six data inputs, respectively (for 1-bit lookup operation). Other specific AND or LUT gate types may, of course, be identified using these same major gate types.

The identified gate type is used as a criterion for selecting a specific formulation for producing signature value information in the present embodiment. Improved signature effectiveness can result where different formulations for signature values are applied to different gate types. The signature value for a gate is an opportunity to succinctly represent important distinguishing characteristics of a gate instance, and what is effectively most important may vary between gate types. In the presently described embodiment, one signature information formulation is considered the default formulation or scheme and, preferably, produces a good result for a number of major gate types. In this embodiment, major gate types for which signature production is desired using other than the default formulation are considered special types. After the major gate type is identified at 710, a determination is made at 720 whether the major gate type is a special type. If so, the signature information for the gate instance is produced at 730 using a signature formulation associated with the gate type. If not, signature information for the gate instance is produced at 740 using the default formulation. While gate type has been described as the attribute of a gate that conditions the formulation used for signature production, i.e., the conditioning parameter, different attributes, and combinations of attributes, could be used.

Embodiments can, of course, vary on the number of different signature formulations implemented and the degree of sophistication in associating a particular gate instance with a particular signature formulation. Good results can be obtained, however, applying the same signature scheme to all gate instances belonging to a major gate type. That is to say, maintaining many, very specifically applied signature schemes does not necessarily improve signature effectiveness in the duplicate identification and extraction process, and may increase the difficulty in arriving at a set of signature formulations that cohere (by not producing a large number of unproductive signature collisions).

The processing of block 720-740 just discussed is now illustrated by referring to an example embodiment that includes AND, OR, NAND, NOR, XOR, Lookup Table (LUT), and D Flip-Flop (DDF) major gate types. In this illustrative embodiment the determination at block 720 is made by identifying the current gate as a special type if it is identified as belonging to the LUT or DDF major types. A current gate identified with the AND, OR, NAND, NOR, or XOR major types is not considered special and will be treated using the default signature information scheme of block 740. Whether special or default, the signature information produced for a gate in this illustrative embodiment is a 128-bit value, viewed as an array of four 32-bit words. Note that the 128-bit signature information now discussed is an intermediate product in the processing of FIG. 7, and is not necessarily the final signature value, although it could be.

The production of signature information of block 740 according to the default formulation of the present embodiment is accomplished by the following. The first word of the signature information is set to a value that indicates the major block type. Including the major block type significantly in the formulation of a signature for a gate helps assure that gate instances of dissimilar types will not share the same signature. The second word of the signature information is also set to a value indicating the major block type, increasing its influence on the signature value. The third word of the signature information represents the input signal sources to the gate. Identifying information for the input signal sources of the gate information in the circuit design is summed together retaining 32 bits. One example of identifying information that may be used is pointers to the gate information for input signal sources within the circuit design. The fourth word of the signature information using the default formulation similarly represents the input signal sources to the gate. For the fourth word, however, the identifying information for the input signal sources is XOR'ed together, rather than summed. This default formulation for signature information is applied to gate instances having an AND, OR, NAND, NOR, or XOR major type, for the illustrative embodiment.

In one embodiment, all of the gate attributes used to formulate a signature are directly stored in a data structure that represents the current gate within the circuit design. Such immediate availability of gate attributes/parameters/datums/descriptors used in signature formulation can enhance performance.

The production of signature information of block 730 according to formulations for special gate types of the present embodiment is accomplished by the following. If the major type of the special gate is LUT, signature information is composed as follows. The first word of the signature information is set to a value that indicates the LUT major block type. The second and third words of the signature information are used to record the stored content of the lookup table, i.e., the truth table for the logic function performed by the LUT. The fourth word of the signature information represents the input signal sources to the LUT gate. Identifying information for the input signal sources of the gate information in the circuit design is summed together retaining 32 bits. This formulation for LUT signature information emphasizes LUT contents relative to the default formulation. Both may be viewed, however, as emphasizing the logic function performed by the gate though, necessarily, by different means. In the case of those major gate types that receive default treatment in the present embodiment, the logic function performed by the gate inheres in its gate type. In the case the LUT major gate type, the logic performed by the gate inheres in its lookup table contents.

If the major type of the special gate is DFF, signature information is composed in 730 as follows. Once again, the first word of the signature information is set to a value that indicates the major block type—here, DFF. The second word is set to a value indicating the signal source for the D input of the gate, giving that input particular significance in the signature formulation. The third and fourth words represent the gate inputs in the aggregate as in the default formulation. Identifying information for the input signal sources of the gate information in the circuit design is summed together retaining 32 bits for the third word. For the fourth word, the identifying information for the input signal sources is XOR'ed together, rather than summed.

Good results are achieved by formulating signature information after the fashion described for the illustrative embodiment above. One of skill in the art recognizes that many variations on the specific details are possible without departing from the novel subject matter disclosed herein.

At 750, the signature information composed for the current gate is compressed to the target signature size. This is true regardless of the signature formulation used to compose the information. The result of the compression is the signature value for the current gate. In one embodiment, a progressive, multistep compression process is used. This can facilitate dynamic adaptation of signature mode as previously discussed. In one such illustrative embodiment, 128-bit signature information is first reduced to 32 bits by XORing together the four bytes for each of the four 32-bit words that make up the 128-bit signature information. To produce a yet smaller signature, the 32-bit signature information is then reduced to eight bits by adding together the four bytes that compose the signature information and retaining the low order eight bits of the sum. Good results, i.e., an acceptable number of undesired signature collisions and misses, can be obtained using 8-bit signature values. The small size of the 8-bit signature values offers many performance advantages including signature table density and compactness, which further contributes to high cache residency. The compression of 750 results in a signature value for the current gate and the process is exited at 799.

While the signature based duplicate extraction described above using single entry signature table slots does not guarantee elimination of all duplicates, it can eliminate a very substantial percentage of duplicate gates with only a fraction of the resources and associated runtimes required by other methods. Moreover, by having multiple entry slots to hold the most recent two, or three, or four, or more, most recent same-signatured gates, duplicate gate elimination could be driven to or near one hundred percent.

Novel subject matter has been disclosed and explained by use of various illustrative embodiments included in the figures and written description. The disclosed embodiments were intended as an aid to develop an understanding of novel subject matter and were not intended to define, constrain, or limit the invention by reference to the details of these illustrative embodiments. Many departures, deviations, and variations from the disclosed embodiments and variants are well within the grasp of one of ordinary skill in the art. For example, many processes, formulations, and schemes are possible for producing gate signatures. As another example, many logical and physical data structures and representations are possible for implementing a signature table—a table in any strict sense may not be used at all. The described signature tables are used to associate the current gate with one or more same-signatured prior gates, and other data processing constructs could serve that function. Accordingly, one of skill in the art will not see the disclosed embodiments as limiting the inventive subject matter but, rather, will understand the scope of the inventive subject matter by the claims that follow.

What is claimed is:

1. A method for use in Electronic Design Automation (EDA) processing for removal of duplicative gates from a circuit design represented in computer storage, said method comprising:

determining, by a computer processor, a signature value based at least in part on one or more parameters of a current gate selected from a plurality of gates of a circuit design storage portion, said signature value further corresponding to a signature table slot;

comparing said current gate to a prior gate associated with said signature table slot and modifying said circuit design storage portion to consolidate said current gate and said prior gate if said comparing indicates duplication; and associating said current gate with said signature table slot if said comparing does not indicate duplication.

2. The method of claim 1, wherein said one or more parameters comprise information about an input signal source for said current gate.

3. The method of claim 2, wherein said information about an input signal source comprises a reference to a gate of said plurality of gates of said circuit design storage portion.

4. The method of claim 1, wherein the one or more parameters used in determining a signature value are conditioned at least in part on a type identifier associated with said current gate.

5. The method of claim 1, wherein said determining further comprises compressing signature information.

6. The method of claim 5, wherein said compressing is based at least in part on information about collision history.

7. The method of claim 1, wherein said comparing comprises determining whether said current gate and said prior gate are associated with a common type identifier.

8. The method of claim 7, wherein said comparing further comprises determining whether a first input signal source is associated with a first input of said current gate and a corresponding input of said prior gate.

9. The method of claim 1, wherein said associating said current gate with said signature table slot comprises storing a reference to the current gate in a signature slot entry.

10. The method of claim 1, wherein said one or more parameters comprise information including a reference to an input signal source gate of said plurality of gates of said circuit design, wherein the one or more parameters used in determining a signature value are conditioned at least in part on a type identifier associated with said current gate, wherein said determining a signature value further comprises compressing signature information based at least in part on information about collision history, wherein said comparing comprises determining whether said current gate and said prior gate are each associated with a first type identifier and with a common input signal source at corresponding inputs, and wherein said associating said current gate with said signature table slot comprises storing a reference to the current gate in a signature slot entry.

11. A computer system for producing integrated circuit design files by electronic design automation with optimizations including the removal of duplicate gates from a computer representation of a circuit design, comprising:

a processor;

first program code storage coupled to said processor and comprising stored instructions directing the execution of said processor for identifying a first gate from a plurality of gates of a stored circuit design as a current gate;

second program code storage coupled to said processor and comprising stored instructions directing the execution of said processor for determining a signature value dependent on one or more attributes of said current gate and corresponding to a signature table slot; and third program code storage coupled to said processor and comprising stored instructions directing the execution of said processor for determining whether a prior gate is associated with said signature table slot and, if not, associating said current gate with said signature table slot, and, if so, comparing said current gate with said prior gate, and modifying said stored circuit design to consolidate said prior gate and said current gate if said comparing indicates duplication, otherwise associating said current gate with said signature table slot.

12. The computer system of claim 11, wherein said one or more attributes comprise information about an input signal source for said current gate.

13. The computer system of claim 12, wherein said information about an input signal source comprises a reference to a gate of said plurality of gates of said circuit design.

14. The computer system of claim 11, wherein the one or more attributes used in determining a signature value are conditioned at least in part on a type identifier associated with said current gate.

15. The computer system of claim 11, wherein said determining a signature value further comprises compressing signature information.

16. The computer system of claim 15, wherein said compressing is based at least in part on information about collision history.

17. The computer system of claim 11, wherein said comparing comprises determining whether said current gate and said prior gate are associated with a common type identifier.

18. The computer system of claim 17, wherein said comparing further comprises determining whether a first input signal source is associated with a first input of said current gate and a corresponding input of said prior gate.

19. The computer system of claim 11, wherein said associating said current gate with said signature table slot comprises storing a reference to the current gate in a signature slot entry.

20. The computer system of claim 11, wherein said associating said current gate with said signature table slot comprises storing a reference to the current gate in a signature slot entry.

21. The computer system of claim 20, wherein said associating said current gate with said signature table slot further comprises eliminating an earlier association between said signature table slot and a gate of said stored circuit design.

22. The computer system of claim 21, wherein said signature table slot comprises a single signature table entry.

23. The computer system of claim 11, wherein said one or more attributes comprise information including a reference to an input signal source gate of said plurality of gates of said circuit design, wherein the one or more attributes used in determining a signature value are conditioned at least in part on a type identifier associated with said current gate, wherein said determining a signature value further comprises compressing signature information based at least in part on information about collision history, wherein said comparing comprises determining whether said current gate and said prior gate are each associated with a first type identifier and with a common input signal source at corresponding inputs, wherein said associating said current gate with said signature table slot comprises storing a reference to the current gate in a signature slot entry, wherein said associating said current gate with said signature table slot comprises storing a reference to the current gate in a signature slot entry, eliminating an earlier association between said signature table slot and a gate of said stored circuit design, and wherein said signature slot comprises a single signature table entry.

* * * * *